(12) United States Patent
Noderer et al.

(10) Patent No.: US 12,062,601 B2
(45) Date of Patent: Aug. 13, 2024

(54) POWER SEMICONDUCTOR MODULE HAVING A DC VOLTAGE CONNECTING DEVICE

(71) Applicant: SEMIKRON ELEKTRONIK GMBH & CO. KG, Nuremberg (DE)

(72) Inventors: Manuel Noderer, Nuremberg (DE); Alexander Wehner, Nuremberg (DE); Jürgen Steger, Hiltpoltstein (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 198 days.

(21) Appl. No.: 17/949,959

(22) Filed: Sep. 21, 2022

(65) Prior Publication Data

US 2023/0112316 A1    Apr. 13, 2023

(30) Foreign Application Priority Data

Sep. 29, 2021   (DE) ................... 10 2021 125 216.4

(51) Int. Cl.
*H01L 23/49*        (2006.01)
*H01G 2/02*         (2006.01)
(Continued)

(52) U.S. Cl.
CPC ......... *H01L 23/49811* (2013.01); *H01G 2/02* (2013.01); *H01L 25/072* (2013.01); *H01R 4/029* (2013.01)

(58) Field of Classification Search
CPC ... H01L 23/49811; H01L 25/072; H01G 2/02; H01R 4/029
See application file for complete search history.

(56) References Cited

U.S. PATENT DOCUMENTS

2017/0345799 A1\* 11/2017 Rowden ................ H01L 25/072
2019/0020285 A1\* 1/2019 Kobolla ............... H05K 1/0209
(Continued)

FOREIGN PATENT DOCUMENTS

DE      102017115883 A1    1/2019
DE      102020111574 B3    7/2021
DE      102020111574 B3 \*  7/2021 ........... H01L 25/072

OTHER PUBLICATIONS

DE 10 2021 125 216.4, Office Action dated May 6, 2022, 7 pages—German, 7 pages—English.

Primary Examiner — Mukundbhai G Patel
(74) Attorney, Agent, or Firm — Andrew F. Young; Nolte Lackenbach Siegel

(57) ABSTRACT

A power semiconductor module has a substrate, with power semiconductor components, and a DC voltage connecting device, which has a first and a second flat conductor connecting element and at least one first metal layer connecting element and at least one second metal layer connecting element, wherein the second flat conductor connecting element is arranged spaced apart in the normal direction of the first flat conductor connecting element from the first flat conductor connecting element, the first flat conductor connecting element is electrically connected by the first metal layer connecting element and the second flat conductor connecting element is electrically connected by the second metal layer connecting element to the metal layer, the first flat conductor connecting element has a flat conductor end section and a flat conductor connection section arranged between the one first metal layer connecting element and the flat conductor end section.

16 Claims, 6 Drawing Sheets

(51) Int. Cl.
*H01L 23/498* (2006.01)
*H01L 25/07* (2006.01)
*H01R 4/02* (2006.01)

(56) References Cited

U.S. PATENT DOCUMENTS

2019/0067167 A1* 2/2019 Hong ...................... H01L 25/18
2021/0336357 A1* 10/2021 Steger ................ H01R 43/0221

* cited by examiner

POWER SEMICONDUCTOR MODULE HAVING A DC VOLTAGE CONNECTING DEVICE

CROSS REFERENCE TO RELATED APPLICATIONS

This application relates to and claims priority to DE 10 2021 125 216.4 filed Sep. 29, 2022, the entire contents of which are incorporated herein fully by reference.

FIGURE SELECTED FOR PUBLICATION

FIG. 1.

BACKGROUND OF THE INVENTION

Field of the Invention

The invention relates to a power semiconductor module having a substrate, having power semiconductor components, and having a DC voltage connecting device.

Description of the Related Art

A power semiconductor module having a substrate, having power semiconductor components, and having a DC voltage connecting device is known from DE 10 2020 111 574 B3.

The technical requirement is placed on such a power semiconductor module that it can be electrically conductively contacted with a DC voltage busbar with low inductance, in particular by means of welded bonds, which are formed in particular as laser welded bonds.

Aspects and Objects of the Invention

It is the object of the invention to provide a power semiconductor module which can be electrically conductively contacted with a DC voltage busbar with low inductance, in particular by means of welded bonds, which are formed in particular as laser welded bonds.

This object is achieved by a power semiconductor module having a substrate, which has an electrically nonconductive substrate insulating layer and a metal layer structured to form conductor tracks and arranged on the substrate insulating layer, having power semiconductor components arranged on the metal layer and electrically conductively connected to the metal layer and having a DC voltage connecting device, which has a first and a second flat conductor connecting element and at least one first metal layer connecting element and at least one second metal layer connecting element, wherein in operation of the power semiconductor module, the first flat conductor connecting element has a first electrical polarity and the second flat conductor connecting element has a second electrical polarity, wherein the second flat conductor connecting element is arranged spaced apart in the normal direction of the first flat conductor connecting element from the first flat conductor connecting element, wherein the first flat conductor connecting element is electrically conductively connected by means of the at least one first metal layer connecting element and the second flat conductor connecting element is electrically conductively connected by means of the at least one second metal layer connecting element to the metal layer, wherein the first flat conductor connecting element has a flat conductor end section and a flat conductor connection section arranged between the at least one first metal layer connecting element and the flat conductor end section, wherein the width of the flat conductor end section is greater than the minimum width of the flat conductor connection section in the course of the flat conductor connection section from the at least one first metal layer connecting element to the flat conductor end section, wherein at least one region of the flat conductor end section is not overlapped by the second flat conductor connecting element.

It has proven to be advantageous if the width of the second flat conductor connecting element is less than the width of the flat conductor end section. The DC voltage connecting device is made particularly low inductance in this way.

Furthermore, it has proven to be advantageous if the DC voltage connecting device is arranged on one side of the substrate insulating layer, wherein the width of the flat conductor end section is at least 90% of the width of the side of the substrate insulating layer on which the DC voltage connecting device is arranged. The power semiconductor module is made particularly narrow in this way.

Furthermore, it has proven to be advantageous if the entire flat conductor end section is not overlapped by the second flat conductor connecting element. In this way, the entire flat conductor end section is available for the electrical connection to a DC voltage busbar.

Furthermore, it has proven to be advantageous if the minimum width of the flat conductor connection section in the course of the flat conductor connection section from the at least one first metal layer connecting element to the flat conductor end section is equal to or greater than the width of the second flat conductor connecting element. The DC voltage connecting device is made particularly low inductance in this way.

Furthermore, it has proven to be advantageous if at least 90% of the second flat conductor connecting element, in particular the entire second flat conductor connecting element, is arranged aligned with the flat conductor connection section in the normal direction of the first flat conductor connecting element. The DC voltage connecting device is made particularly low inductance in this way.

Furthermore, it has proven to be advantageous if an electrically nonconductive first insulating layer is arranged between the first and second flat conductor connecting element. The DC voltage connecting device has a high dielectric strength in this way.

Furthermore, it has proven to be advantageous if the respective flat conductor connecting element is formed as a metal foil or metal plate, having a thickness of preferably 300 μm to 2000 μm, in particular of preferably 500 μm to 1500 μm. The DC voltage connecting device is made particularly low inductance in this way.

Furthermore, it has proven to be advantageous if the first flat conductor connecting element is arranged on an electrically nonconductive second insulating layer. By means of the second insulating layer, the first flat conductor connecting element can be electrically insulated from a heat sink or from a base plate on which the substrate is possibly arranged.

Furthermore, a power-electronics arrangement has proven to be advantageous having a power semiconductor module according to the invention and having a DC voltage busbar, which has a first and a second flat conductor and an electrically nonconductive third insulating layer, which electrically insulates the first and second flat conductor from one another, wherein the first flat conductor is electrically conductively connected by means of a first welded bond, formed in particular as a laser welded bond, to the flat conductor end section, and the second flat conductor is electrically conductively connected by means of a second welded bond, in particular formed as a laser welded bond, to the second flat conductor connecting element, wherein the first flat conductor has a first welded bond region, through which the first welded bond is formed, and the second flat conductor has a second welded bond region, through which the second welded bond is formed.

Furthermore, it has proven to be advantageous if the thickness of the first flat conductor in the first welded bond region is less than the thickness of a first flat conductor region of the first flat conductor adjoining the first welded bond region. In this way, the first flat conductor can be welded to the flat conductor end section in a particularly simple and energy-saving manner, in particular by means of a laser beam which strikes the first welded bond region, since less material of the first flat conductor has to be melted, in particular by means of the laser beam, to implement the welded bond.

Furthermore, it has proven to be advantageous if the thickness of the second flat conductor in the second welded bond region is less than the thickness of a second flat conductor region of the second flat conductor adjoining the second welded bond region. In this way, the second flat conductor can be welded to the second flat conductor connecting element in a particularly simple and energy-saving manner, in particular by means of a laser beam which strikes the second welded bond region, since less material of the second flat conductor has to be melted, in particular by means of the laser beam, to implement the welded bond.

Furthermore, it has proven to be advantageous if the third insulating layer does not have a region which is arranged aligned with the first welded bond region in the normal direction of the first welded bond region and the second flat conductor does not have a region which is arranged aligned with the first welded bond region in the normal direction of the first welded bond region. In this way, the first flat conductor can be welded to the flat conductor end section in a particularly simple and energy-saving manner, in particular by means of a laser beam which strikes the first welded bond region, since the first welded bond region is not covered by the insulating layer and the flat conductor end section.

It has proven to be advantageous in this context if the third insulating layer has an insulating layer recess in the normal direction of the first welded bond region, aligned with the first welded bond region, and the second flat conductor has a flat conductor recess in the normal direction of the first welded bond region, aligned with the first welded bond region. In this way, the first flat conductor can be welded to the flat conductor end section in a particularly simple and energy-saving manner, in particular by means of a laser beam which strikes the first welded bond region, since the first welded bond region is not covered by the insulating layer and the flat conductor end section.

It has proven to be advantageous in this context if the insulating layer recess and/or the flat conductor recess is respectively formed as a lateral constriction. With this formation of the recesses, holes passing through the third insulating layer and/or through the second flat conductor are not required to form these recesses.

Furthermore, it has proven to be advantageous if the third insulating layer has an insulating layer boundary section running in the normal direction of the first welded bond region and extending along a boundary edge of the second flat conductor. The DC voltage busbar has a particularly high dielectric strength in this way.

Furthermore, it has proven to be advantageous if the third insulating layer is formed as an electrically nonconductive insulating film or as a plastic injection molded part. If the third insulating layer is formed as an electrically nonconductive insulating film, the DC voltage busbar has a particularly low inductance, since the distance between the first and the second flat conductor is very small. If the third insulating layer is formed as a plastic injection molded part, the third insulating layer has a high resistance with respect to mechanical stresses, in particular with respect to mechanical oscillating stresses, so that the first and second flat conductor are electrically insulated from one another particularly reliably by means of the plastic injection molded part. Furthermore, in this case the DC voltage busbar has a particularly high dielectric strength.

Furthermore, it has proven to be advantageous if the power-electronics arrangement has a capacitor, wherein the first and second flat conductor are electrical connecting elements of the capacitor. In this way, the power semiconductor module according to the invention is electrically conductively connected to the capacitor in a particularly low inductance manner.

One exemplary embodiment of the invention is explained hereinafter with reference to the figures below. In the figures:

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
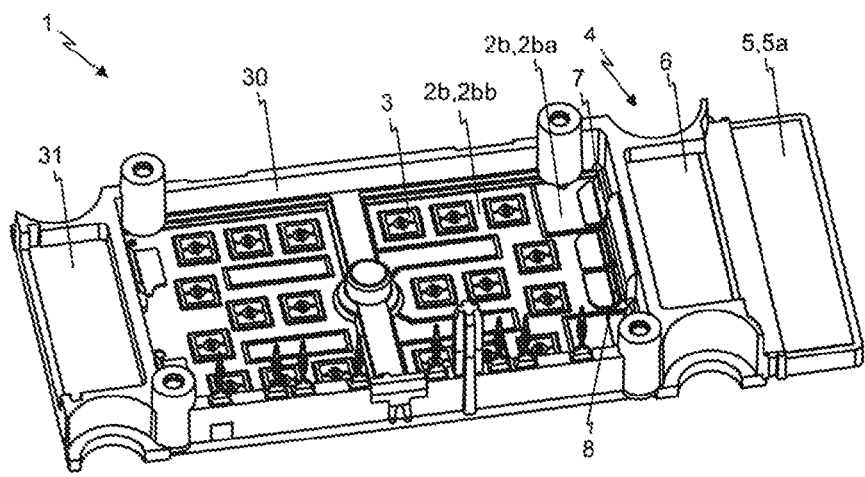
FIG. 1 shows a perspective view of a power semiconductor module according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 2:
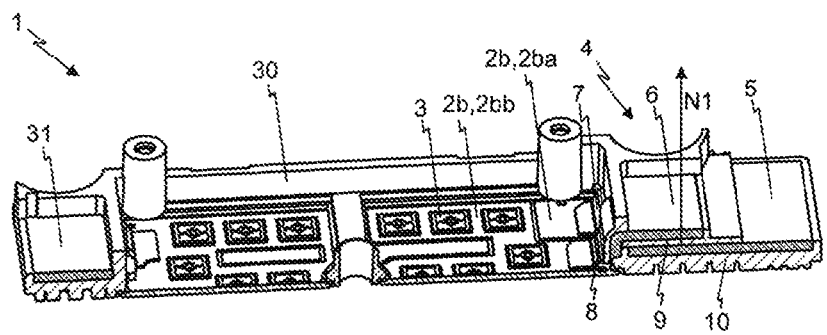
FIG. 2 shows a perspective sectional view of a power semiconductor module according to the invention.
Figure 3:
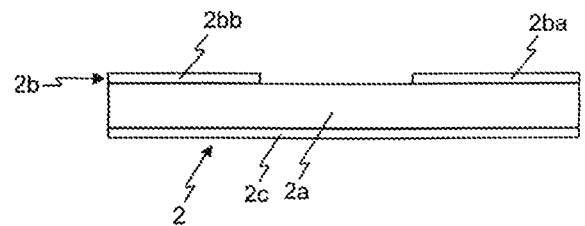
FIG. 3 shows a schematic sectional view of a region of a substrate of a power semiconductor module according to the invention.
Figure 4:
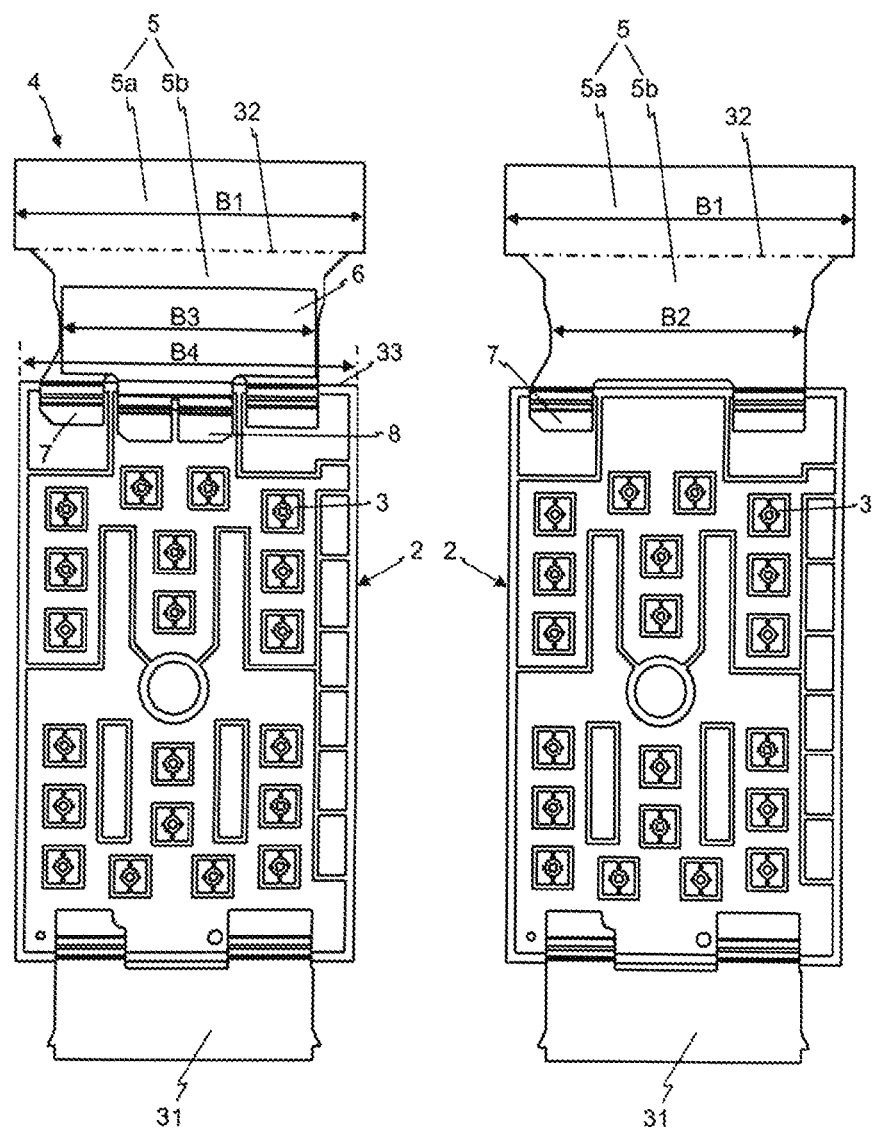
FIG. 4 shows top views of essential elements of a power semiconductor module according to the invention.

FIG. 1 shows a perspective view of a power semiconductor module 1 according to the invention and FIG. 2 shows a perspective sectional view of the power semiconductor module 1. FIG. 3 shows a schematic sectional view of a region of a substrate 2 of the power semiconductor module 1. FIG. 4 shows top views of essential elements of the power semiconductor module 1, wherein in the right image in FIG. 4, a second flat conductor connecting element 6 of the power semiconductor module 1 is not shown in relation to the left image.

The power semiconductor module 1 according to the invention has a substrate 2, which has an electrically non-conductive insulating layer 2a and a metal layer 2b, which is arranged on the insulating layer 2a and is structured to form conductor tracks 2ba, 2bb. The substrate 2 preferably has an electrically conductive, preferably unstructured further metal layer 2c, wherein the insulating layer 2a is arranged between the metal layer 2b and the further metal layer 2c. The insulating layer 2a can be formed, for example, as a ceramic plate. The substrate 2 can be formed, for example, as a direct copper bonded substrate (DCB substrate), as an active metal brazing substrate (AMB substrate), or as an insulated metal substrate (IMS).

The power semiconductor module 1 furthermore has power semiconductor components 3 which are arranged on the metal layer 2b and electrically conductively connected to the metal layer 2b. The power semiconductor components 3 are preferably electrically conductively contacted by means of a soldered bond or sintered bond with the metal layer 2b. The respective power semiconductor component 3 is preferably provided in the form of a power semiconductor switch or a diode. The power semiconductor switches 3 are generally provided here in the form of transistors, for example, IGBTs (insulated gate bipolar transistor) or MOSFETs (metal oxide semiconductor field effect transistor), or in the form of thyristors.

It is to be noted that the power semiconductor components 3 are electrically conductively connected to one another on their side facing away from the substrate 2, by means of, for example, bond wires and/or an electrically conductive film composite, and are electrically conductively connected to the conductor tracks of the substrate 2, in accordance with the desired electrical circuit, for example, a half-bridge circuit, which the power semiconductor module 1 is to implement. For the sake of clarity, these electrical connections are not shown in the figures.

The power semiconductor module 1 furthermore has a DC voltage connecting device 4, which has a first and a second flat conductor connecting element 5 and 6 and at least one first metal layer connecting element 7 and at least one second metal layer connecting element 8, wherein in operation of the power semiconductor module 1, the first flat conductor connecting element 5 has a first electrical polarity and the second flat conductor connecting element 6 has a second electrical polarity. The first polarity can be positive and the second polarity can be negative or vice versa. The second flat conductor connecting element 6 is arranged spaced apart from the first flat conductor connecting element 5 in the normal direction N1 of the first flat conductor connecting element 5. The first flat conductor connecting element 5 has a flat conductor end section 5a and a flat conductor connection section 5b arranged between the at least one first metal layer connecting element 7 and the flat conductor end section 5a. In FIG. 4, the border 32 between the flat conductor end section 5a and the flat conductor connection section 5b is shown by dot-dash lines. The flat conductor end section 5a preferably has a uniform width B1.

The DC voltage connecting device 4 is preferably arranged on a side 33 of the substrate insulating layer 2a.

The first and second flat conductor connecting elements 5 and 6 are used for the electrically conductive connection of the power semiconductor module 1 to an external electrical device, for example, a capacitor.

The first flat conductor connecting element 5 is electrically conductively connected by means of the at least one first metal layer connecting element 7 and the second flat conductor connecting element 6 is electrically conductively connected by means of the at least one second metal layer connecting element 8 to the metal layer 2b. In the scope of the exemplary embodiment, the at least one first metal layer connecting element 7 is electrically conductively connected to the conductor track 2ba of the metal layer 2b and the second metal layer connecting element 8 is electrically conductively connected to the conductor tracks 2bb of the metal layer 2b, for example, by means of a sintered, soldered, or welded bond. In the scope of the exemplary embodiment, the power semiconductor module 1 has a third flat conductor connecting element 31, which is electrically conductively connected to metal layer 2b and has an alternating electrical polarity in operation of the power semiconductor module 1. The third flat conductor connecting element 31 is used for the electrical connection of the power semiconductor module 1 to a further external electrical device, for example, an electric motor.

The power semiconductor module 1 preferably has a housing element 30. At least respectively one part of the first and second flat conductor connecting elements 5 and 6 are arranged outside the housing element 30. The housing element 30 preferably extends laterally around the substrate 2. The DC voltage connecting device 4 is preferably materially bonded to the housing element 30.

The first and the second flat conductor connecting element 5 and 6 are preferably each formed in one piece from a sheet-metal element. The first flat conductor connecting element 5 is preferably formed in one piece with the at least one first metal layer connecting element 7 and the second flat conductor connecting element 6 is preferably formed in one piece with the at least one second metal layer connecting element 8.

The width B1 of the flat conductor end section 5a is greater according to the invention than the minimal width B2 of the flat conductor connection section 5b in the course of the flat conductor connection section 5b from the at least one first metal layer connecting element 7 to the flat conductor end section 5a, wherein at least one region of the flat conductor end section 5a is not overlapped by the second flat conductor connecting element 6. In this way, the power semiconductor module can be electrically conductively contacted with low inductance, in particular by means of welded bonds, with a DC voltage busbar.

The width B3 of the second flat conductor connecting element 6 is preferably less than the width B1 of the flat conductor end section 5a.

The width B1 of the flat conductor end section 5a is preferably at least 90% of the width B4 of the side 33 of the substrate insulating layer 2a on which the DC voltage connecting device 4 is preferably arranged.

The entire flat conductor end section 5a is preferably not overlapped by the second flat conductor connecting element 6.

The minimum width B2 of the flat conductor connection section 5b in the course of the flat conductor connection section 5b from the at least one first metal layer connecting element 7 to the flat conductor end section 5a is preferably equal to or greater than the width B3 of the second flat conductor connecting element 6.

Preferably, at least 90% of the second flat conductor connecting element 6, in particular the entire second flat conductor connecting element 6, is arranged aligned with the flat conductor connection section 5b in the normal direction N1 of the first flat conductor connecting element 5.

An electrically nonconductive first insulating layer 9 is preferably arranged between the first and second flat conductor connecting element 5 and 6.

The respective flat conductor connecting element 5 or 6 is preferably formed as a metal foil or metal plate having a thickness of preferably 300 μm to 2000 μm, in particular of preferably 500 μm to 1500 μm. The respective flat conductor connecting element 5 or 6 is preferably formed from copper or from a copper alloy.

The first flat conductor connecting element 5 is preferably arranged on an electrically nonconductive second insulating layer 10.

The power semiconductor module 1 preferably has a heat sink 11 or a base plate, wherein the substrate 2 and, if present, the second insulating layer 10 is arranged on the heat sink 11 or on the base plate. The base plate is provided to be arranged on a heat sink. The base plate can be formed, for example, as a metal plate which is used for the thermal attachment of the substrate 2 to a heat sink. The heat sink 11 preferably has cooling fins or cooling pins 11a (see FIG. 6 and FIG. 7).

Figure 5:
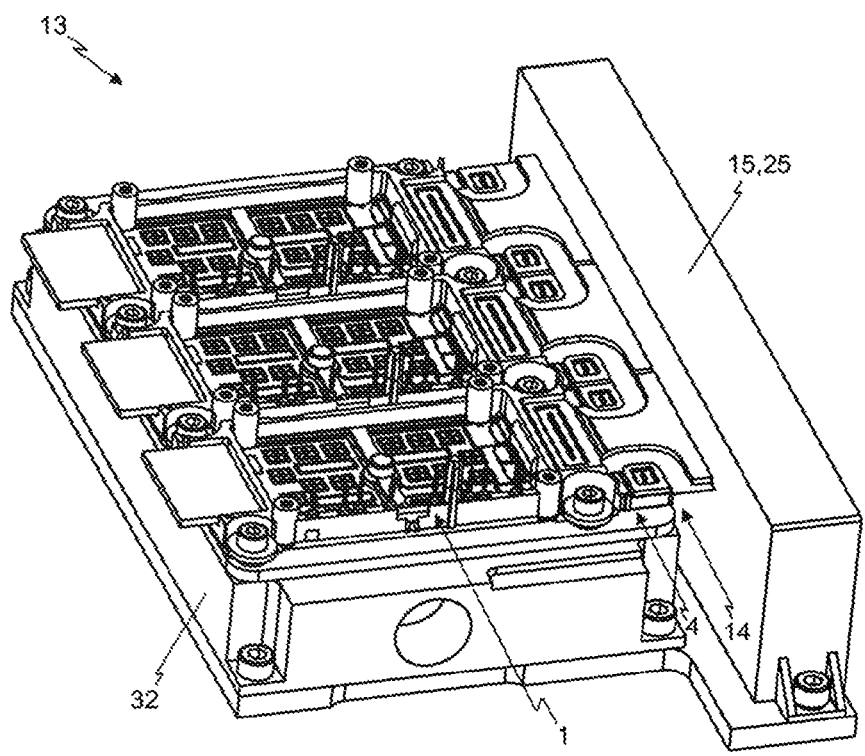
FIG. 5 shows a perspective view of a power-electronics arrangement having a power semiconductor module according to the invention, having a DC voltage busbar, and having a capacitor.
Figure 6:
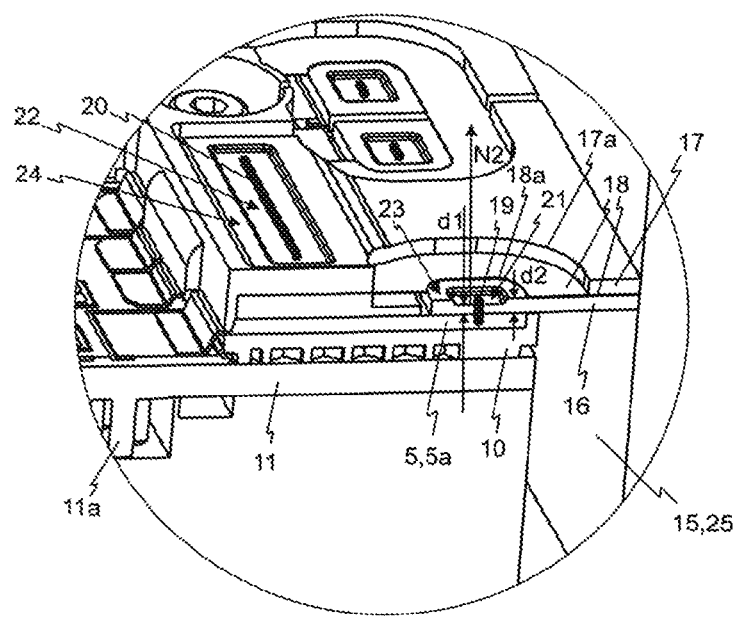
FIG. 6 shows a perspective sectional view of the power-electronics arrangement according to FIG. 5 in the region of a DC voltage connecting device of a power semiconductor module according to the invention.
Figure 7:
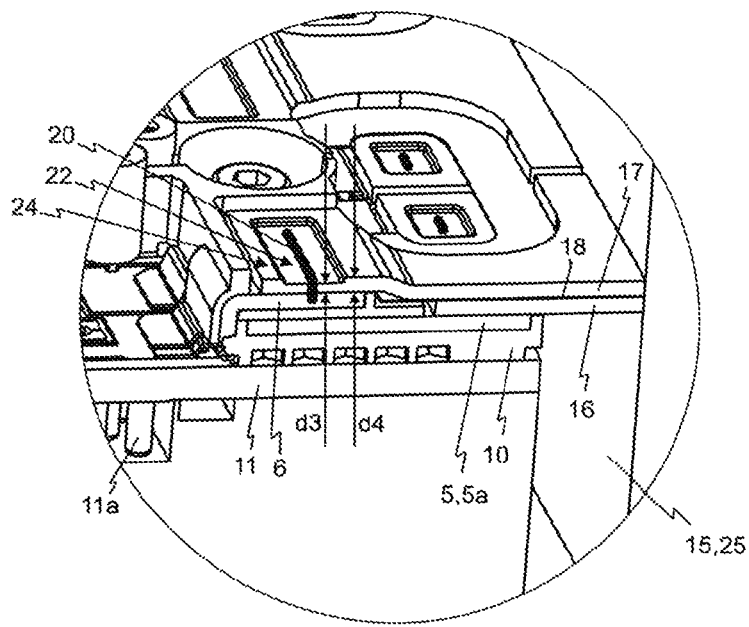
FIG. 7 shows a further perspective sectional view of the power-electronics arrangement according to FIG. 5 in the region of a DC voltage connecting device of a power semiconductor module according to the invention.
Figure 8:
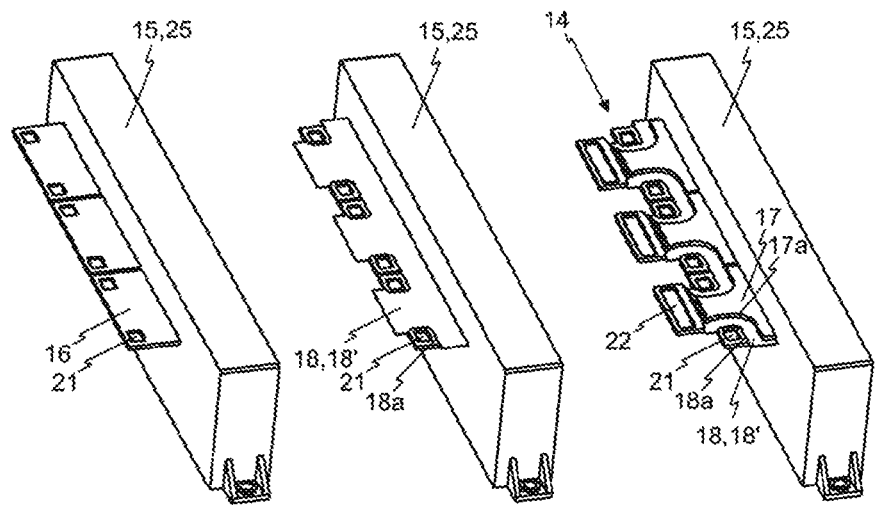
FIG. 8 shows perspective views of a design of essential elements of a DC voltage busbar of a power-electronics arrangement and perspective views of a capacitor.
Figure 9:
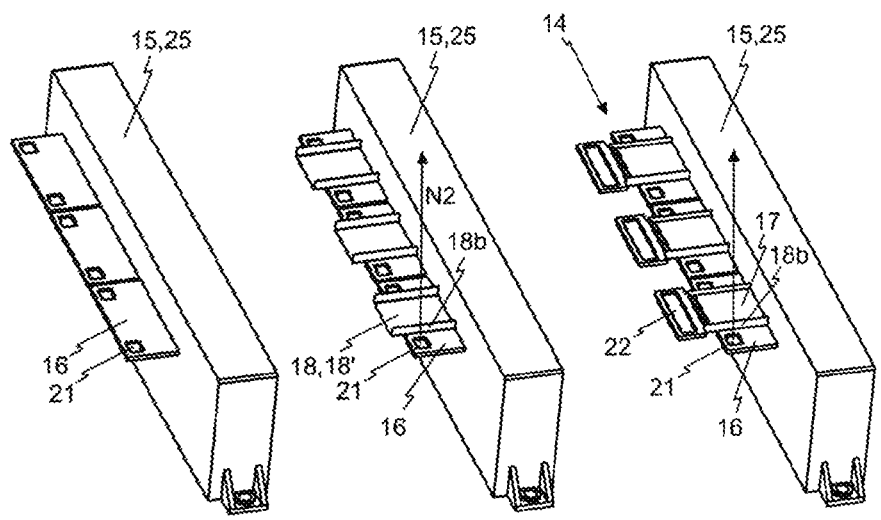
FIG. 9 shows perspective views of a further design of essential elements of a DC voltage busbar of a power-electronics arrangement and perspective views of a capacitor.

FIG. 5 shows a perspective view of a power-electronics arrangement 13 having a power semiconductor module 1 according to the invention, having a DC voltage busbar 14, and having a capacitor 15. In the scope of the exemplary embodiment, the power-electronics arrangement 13 has two further power semiconductor modules according to the invention arranged in series to the power semiconductor module 1 according to the invention and formed identically to the power semiconductor module 1 according to the invention. The two further power semiconductor modules according to the invention are electrically conductively connected in an identical manner to the power semiconductor module 1 to the capacitor 15. FIG. 6 and FIG. 7 show perspective sectional views of the power-electronics arrangement 13 according to FIG. 5 in the region of the DC voltage connecting device 4 of the power semiconductor module 1. In FIG. 8 to FIG. 9, a perspective view of a respective design of essential elements of the DC voltage busbar 14 and a perspective view of the capacitor 15 is shown in each case, wherein the designs only differ from one another in the design of a third insulating layer 18 of the DC voltage busbar 14. In the respective left image, only one first flat conductor 16 of the DC voltage busbar 14 and the capacitor 15 is shown. In the respective middle image, the respective insulating layer 18 is additionally shown. In the respective right image, a second flat conductor 17 of the DC voltage busbar 14 is additionally shown.

The DC voltage busbar 14 has a first and a second flat conductor 16 and 17 and an electrically nonconductive third insulating layer 18, which electrically insulates the first and second flat conductor 16 and 17 from one another. The first flat conductor 16 is electrically conductively connected by means of a first welded bond 19, formed in particular as a laser welded bond, to the flat conductor end section 5a and the second flat conductor 17 is electrically conductively connected by means of a second welded bond 20, formed in particular as a laser welded bond, to the second flat conductor connecting element 6. The first flat conductor 16 has a first welded bond region 21, through which the first welded bond 21 is formed, and the second flat conductor 17 has a second welded bond connection 22, through which the second welded bond 21 is formed.

The first and second flat conductors 16 and 17 are preferably electrical connecting elements of the capacitor 15. The first and second flat conductors 16 and 17 preferably protrude out of a capacitor housing 25 of the capacitor 15.

The thickness d1 of the first flat conductor 16 is preferably less in the first welded bond region 21 than the thickness d2 of a first flat conductor region 23 of the first flat conductor 16 adjoining the first welded bond region 21. The thickness d3 of the second flat conductor 17 is preferably less in the second welded bond region 22 than the thickness d4 of a second flat conductor region 24 of the second flat conductor 17 adjoining the second welded bond region 22 (see FIG. 6 and FIG. 7).

The third insulating layer 18 preferably does not have a region which is arranged aligned with the first welded bond region 21 in the normal direction N2 of the first welded bond region 21 and the second flat conductor 17 preferably does not have a region which is arranged aligned with the first welded bond region 21 in the normal direction N2 of the first welded bond region 21. The third insulating layer 18 preferably has an insulating layer recess 18a in the normal direction N2 of the first welded bond region 21, aligned with the first welded bond region 21, and the second flat conductor 17 preferably has a flat conductor recess 17a in the normal direction N2 of the first welded bond region 21, aligned with the first welded bond region 21. The insulating layer recess 18a and/or the flat conductor recess 17a is preferably respectively formed as a lateral constriction.

Figure 10:
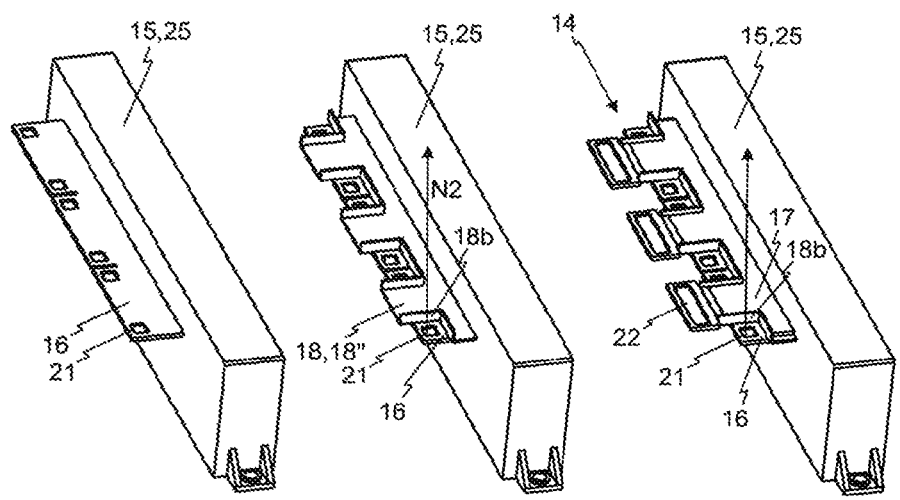
FIG. 10 shows perspective views of a further design of essential elements of a DC voltage busbar of a power-electronics arrangement and perspective views of a capacitor.

As shown by way of example in FIG. 9 and FIG. 10, the third insulating layer 18 preferably has an insulating layer boundary section 18b, which runs in the normal direction N2 of the first welded bond region 21 and extends along a boundary edge of the second flat conductor 17.

As shown by way of example in FIG. 8 and FIG. 9, the third insulating layer 18 can be formed as an electrically nonconductive insulating film 18'. As shown by way of example in FIG. 10, the third insulating layer 18 can be formed as an electrically nonconductive plastic injection molded part 18".

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power-electronics arrangement, comprising:
   a power semiconductor module, further comprising:
      a substrate, which has an electrically nonconductive substrate insulating layer and a metal layer, which is arranged on the substrate insulating layer and is structured to form conductor tracks;
      a plurality of power semiconductor components arranged on the metal layer and electrically conductively connected to the metal layer;
      a DC voltage connecting device, which has a first and a second flat conductor connecting element and at least one first metal layer connecting element and at least one second metal layer connecting element;
      wherein in operation of the power semiconductor module, the first flat conductor connecting element has a first electrical polarity and the second flat conductor connecting element has a second electrical polarity;
      the second flat conductor connecting element is arranged spaced apart from the first flat conductor connecting element in the normal direction of the first flat conductor connecting element;
      the first flat conductor connecting element is electrically conductively connected by means of the at least one first metal layer connecting element to the metal layer;
      the second flat conductor connecting element is electrically conductively connected by means of the at least one second metal layer connecting element to the metal layer;
      the first flat conductor connecting element has a flat conductor end section and a flat conductor connection section arranged between the at least one first metal layer connecting element and the flat conductor end section;
      a width (B1) of the flat conductor end section is greater than a minimum width (B2) of the flat conductor connection section in the course of the flat conductor connection section from the at least one first metal layer connecting element to the flat conductor end section;
      wherein at least one region of the flat conductor end section is not overlapped by the second flat conductor connecting element;
   a DC voltage busbar, which has a first and a second flat conductor and an electrically nonconductive third insulating layer, which electrically insulates the first and second flat conductor from one another;
   wherein the first flat conductor is electrically conductively connected by means of a first welded bond, formed as a laser welded bond, to the flat conductor end section;
   wherein the second flat conductor is electrically conductively connected by means of a second welded bond, formed as a laser welded bond, to the second flat conductor connecting element;
   wherein the first flat conductor has a first welded bond region, through which the first welded bond is formed;
   the second flat conductor has a second welded bond region, through which the second welded bond is formed; and
   wherein the thickness (d1) of the first flat conductor in the first welded bond region is less than the thickness (d2) of a first flat conductor region of the first flat conductor adjoining the first welded bond region.

2. The power-electronics arrangement, according to claim 1, wherein:
   the thickness (d3) of the second flat conductor in the second welded bond region is less than the thickness (d4) of a second flat conductor region of the second flat conductor adjoining the second welded bond region.

3. The power-electronics arrangement, according to claim 1, wherein:
   the third insulating layer does not have a region which is arranged aligned with the first welded bond region in the normal direction (N2) of the first welded bond region; and
   the second flat conductor does not have a region which is arranged aligned with the first welded bond region in the normal direction (N2) of the first welded bond region.

4. The power-electronics arrangement, according to claim 3, wherein:
   the third insulating layer has an insulating layer boundary section, running in the normal direction (N2) of the first welded bond region and extending along a boundary edge of the second flat conductor.

5. The power-electronics arrangement, according to claim 1, wherein:
   the third insulating layer has an insulating layer recess in the normal direction (N2) of the first welded bond region, aligned with the first welded bond region; and
   the second flat conductor has a flat conductor recess in the normal direction (N2) of the first welded bond region, aligned with the first welded bond region.

6. The power-electronics arrangement, according to claim 5, wherein:
   the insulating layer recess and/or the flat conductor recess is respectively formed as a lateral constriction.

7. The power-electronics arrangement, according to claim 1, wherein:
   the third insulating layer is formed as an electrically nonconductive insulating film or as a plastic injection molded part.

8. The power-electronics arrangement, according to claim 1, wherein:
   the power-electronics arrangement has a capacitor; and
   wherein the first and second flat conductors are electrical connecting elements of the capacitor.

9. The power semiconductor module, according to claim 1, wherein:
   a width (B3) of the second flat conductor connecting element is less than the width (B1) of the flat conductor end section.

10. The power semiconductor module, according to claim 9, wherein:
    the DC voltage connecting device is arranged on one side of the substrate insulating layer; and the width (B1) of the flat conductor end section is at least 90% of the width (B4) of the side of the substrate insulating layer on which the DC voltage connecting device is arranged.

11. The power semiconductor module, according to claim 9, wherein:
the entire flat conductor end section is not overlapped by the second flat conductor connecting element.

12. The power semiconductor module, according to claim 9, wherein:
the minimum width (B2) of the flat conductor connection section in the course of the flat conductor connection section from the at least one first metal layer connecting element to the flat conductor end section is equal to or greater than the width (B3) of the second flat conductor connecting element.

13. The power semiconductor module, according to claim 9, wherein:
at least 90% of the second flat conductor connecting element, in particular the entire second flat conductor connecting element, is arranged aligned with the flat conductor connection section in the normal direction (N1) of the first flat conductor connecting element.

14. The power semiconductor module, according to claim 9, wherein:
an electrically nonconductive first insulating layer is arranged between the first and second flat conductor connecting elements.

15. The power semiconductor module, according to claim 9, wherein:
the respective flat conductor connecting element is formed as a metal foil or metal plate, having a thickness of preferably 300 μm to 2000 μm.

16. The power semiconductor module, according to claim 9, wherein:
the first flat conductor connecting element is arranged on an electrically nonconductive second insulating layer.

* * * * *